Sept. 9, 1958 E. A. HENRY 2,851,599

ELECTRONIC COUNTER CIRCUITS

Filed March 28, 1956

United States Patent Office 2,851,599

Patented Sept. 9, 1958

2,851,599

ELECTRONIC COUNTER CIRCUITS

Elliott A. Henry, Newtown, Conn., assignor to Sperry Products, Inc., Danbury, Conn., a corporation of New York Application March 28, 1956, Serial No. 574,549

2 Claims. (Cl. 250—27)

This invention relates to electronic counters, staircase generators, frequency dividers, and the like of the basic double diode counter type. The basic circuit arrangement of the step-type counter conusists of two capacitors and two diodes. When a pulse is impressed on the circuit, the pulse voltage will divide between the capacitors in the ratio of their reactances. During this interval the second diode is nonconducting. When the impressed pulse decreases in voltage one of the capacitors is discharged through the input circuit by means of the second diode, while the other capacitor is prevented from losing its acquired charge by the fact that the first diode is nonconducting during this part of the cycle. The basic requirements for accurate counting are constant pulse amplitude and a charging time constant equal to, or less than, one-fifth of the pulse duration.

A serious drawback of this conventional type of counter, however, is the decrease of successive voltage increments applied across the storage condenser. The disadvantage of this action is that the final increment which raises the charge on the capacitor to the critical firing potential of the discharge device (blocking oscillator, thyratron, and so forth) produces the smallest change in amplitude of the step wave and therefore the greatest possibility of a count error. This means that the accuracy of the critical firing potential of the discharge device must be great, otherwise, counting errors will occur or else the counting series must be limited to comparatively few counts.

It is, therefore, the principal object of this invention to provide a counter circuit wherein the charge may be accumulated on the capacitor in equal steps or even in increasing steps. This means that a greater number of pulses may be counted in one series, and less critical control of the firing potential of the discharge device is required.

Various attempts have been made to achieve the result outlined in the preceding paragraph, but the methods heretofore proposed have resulted in complication of circuitry and multiplication of elements. It is therefore a further object of this invention to accomplish the result of accumulating a charge on the capacitor of a counter circuit in equal or increasing steps without complicating the fundamental counter circuit by any substantial addition of elements.

Further objects and advantages of this invention will become apparent in the following detailed description.

In the accompanying drawings.

Figure 1:
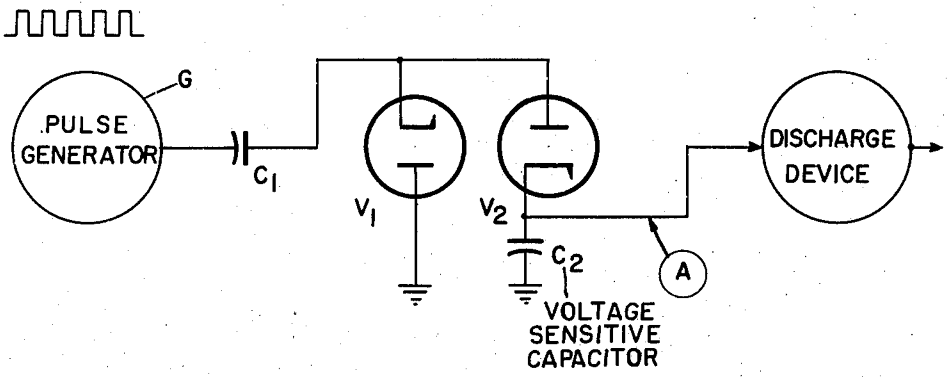
Fig. 1 is an electrical wiring diagram of a circuit embodying one form of the invention.

Referring to Fig. 1 of the drawings, there is disclosed a basic electronic counter circuit, comprising two diodes, V1 and V2 oppositely connected, and two capacitors C1 and C2 arranged with capacitor C1 in the cathode circuit of diode V1 and in the plate circuit of diode V2, and capacitor C2 in the cathode circuit of diode V2. If a pulse from a generator G is applied to the input of the counter circuit, assuming the diodes V1 and V2 have zero forward resistance, the pulse voltage will divide between the capacitors C1 and C2 in proportion to their respective reactances. When the first pulse terminates, diode V1 becomes conductive and clamps capacitor C1 at ground potential with the proportional charge remaining on capacitor C2. The residual charge on capacitor C2 acts as a bias on diode V2 so that V2 will not conduct on the second pulse until its amplitude has risen above this bias voltage. This means that the proportional charge on capacitor C2 from the second pulse is less than the first, the third will be less than the second, and so forth. To put a numerical value on this action, assume that the amplitude of the input pulses is 100 volts and that the reactance of capacitor C1 is nine times that of capacitor C2. Then the charge on capacitor C2 from the first pulse would be 10 volts. Therefore, only 90 volts of the second pulse will be effective, and one tenth of the 90 volts is nine volts, so that the charge on C2 after the second pulse will be 19 volts. The net effective voltage of the third pulse is 81 volts and the added increment is 8.1 volts. This shows that each succeeding step in the charging of capacitor C2 is smaller than the preceding one. It is thus apparent that the final step wave which raises the charge on C2 to the critical firing potential of the discharge device produces the smallest change in amplitude of the step wave across C2 and, therefore, the greatest possibility of error.

To avoid the above described succession of decreasing increments of voltage on the charging capacitor up to the firing voltage, the following change is proposed in the standard electronic counter circuit. Fig. 1 discloses that, at least diagrammatically, the new circuit is the same as the old, with however the following improvement: The capacitor C2 is a voltage sensitive capacitor whose reactance increases as the potential across it increases. Such capacitors are widely used in dielectric amplifiers and generally employ ceramics, such as barium titanate as the dielectric medium. With such a capacitor it can be seen that each increment of charge on C2 increases its reactance, and as a consequence, a greater portion of the effective pulse appears across C2. In other words, the relationship $$\frac{XC2}{XC1+XC2}$$

increases in magnitude with each successive pulse. By proper choice of parameters the staircase may be made to rise in equal steps or even in increasing steps, thus making the final step which trips the discharge device at least equal or even greater than the preceding steps. This means that a greater number of pulses may be counted in one series, and less critical control of the critical firing potential of the discharge device is required.

Figure 2:
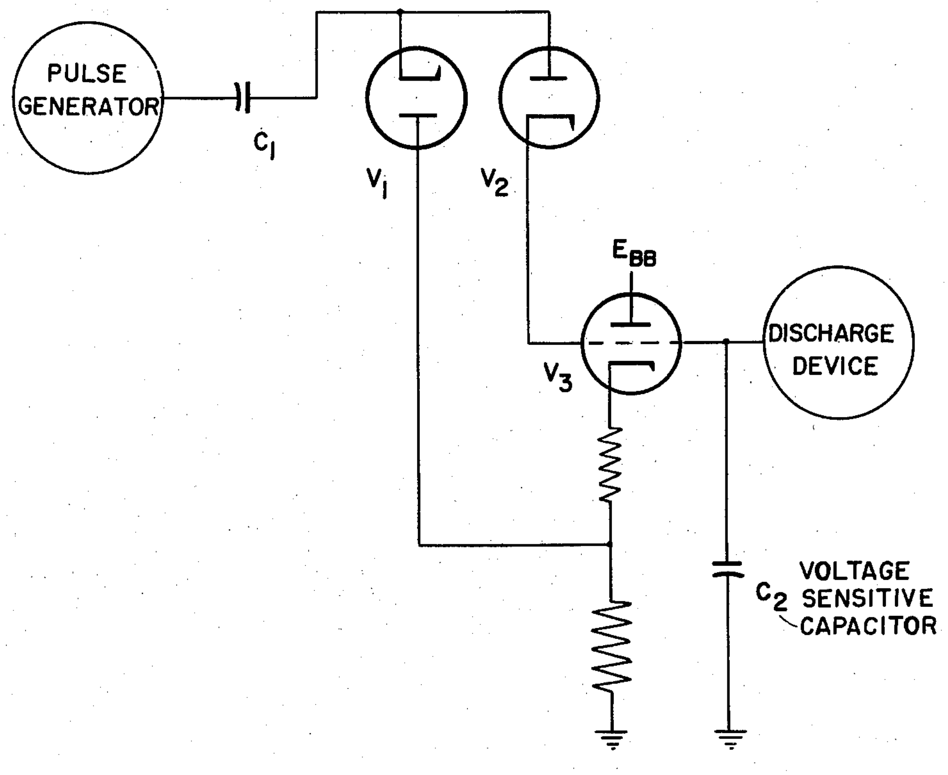
Fig. 2 is a view similar to Fig. 1 showing a modified form of the invention.

In Fig. 2 there is illustrated a modification of the Fig. 1 form of invention, the Fig. 2 form being especially adapted for use where it is desired to impress increasing voltage steps on capacitor C2. For this purpose, instead of clamping capacitor C1 to ground when diode V1 discharges, means are provided for clamping capacitor C1 to the same voltage as exists on capacitor C2. Therefore, the effective voltage, i. e., the difference between the voltage impressed on C1 and the voltage on C2 will always be the same and the increments or steps of voltage on C2 will always be the same. However, if capacitor C2 is formed as hereinbefore described, i. e., as a voltage sensitive capacitor whose reactance increases as the potential across it increases, then the increments of voltage on C2 will be increasingly greater with each step.

To accomplish the foregoing, the capacitor C2 is again connected to the cathode of tube V2, but instead of a direct connection, there is interposed a cathode follower tube V3. Capacitor C2 is connected to the grid of V3 which is also connected to the cathode of V2. The cathode of V3 is connected to the plate of V1. Thus, the voltage acquired by C2 is applied to the grid of follower tube V3, and since the cathode of V3 follows the grid voltage, the voltage acquired by C2 is applied to the cathode of V3. When the pulse diminishes and V1 becomes conductive, capacitor C1 is clamped, not to ground, but to the voltage of cathode V3 which is the same as the voltage of capacitor C2. On the next pulse, the voltage on C1 is the voltage of the pulse, plus the voltage on C2 (which is the same as the voltage on C1). Thus, the effective voltage which is the difference of the voltage on C1 and the voltage on C2 is always the same and, therefore, the increments of voltage on C2 would always be the same were it not for the fact that the capacitor C2 is made, as hereinbefore described in connection with Fig. 1, as a voltage sensitive capacitor whose reactance increases with the increased voltage. Therefore, the voltage increments on C2 will actually increase with each step. To take an example, if the generated pulse is 100 volts, and the reactance of C1 is nine times that of C2, a voltage of 10 will be applied to C2 and to the grid and cathode of V3. This means that on discharge of V1, capacitor C1 is clamped to 10 volts. When the next pulse is generated, the voltage on C1 is 110, but the difference between 110 and the voltage on C2 (10 volts) is still 100. The residual charge on C2 would now be 20 volts. However, since the capacitor C2 is of the voltage sensitive type whose reactance increases with the voltage impressed upon it, the voltage on C2 will be in excess of 20 volts. In other words, the voltage on C2 is increasing not merely by equal, but by increasing steps.

Having described my invention, what I claim and desire the secure by Letters Patent is:

1. A counter circuit comprising a source of voltage pulses, first and second diodes having the cathode of the first diode connected to the anode of the second diode, a coupling capacitor connected between said source and said connected electrodes, a voltage-sensitive storage capacitor connected in the cathode circuit of said second diode, and an output circuit connected to a point between said storage capacitor and the cathode of said second diode; said storage capacitor being of the type whose reactance increases with an increase in its applied voltage, whereby the portion of each pulse from said source which is effective to increase the charge on said storage capacitor increases in accordance with its total accumulated charge.

2. A counter circuit in accordance with claim 1 including a cathode follower having its grid circuit connected to a point between said storage capacitor and said second diode, and having a point on its cathode circuit connected to the anode of said first diode.

References Cited in the file of this patent

UNITED STATES PATENTS

| | | |
|---|---|---|
| 2,182,377 | Guanella | Dec. 5, 1939 |
| 2,491,428 | Tellier | Dec. 13, 1949 |
| 2,573,150 | Lacy | Oct. 30, 1951 |